(12) United States Patent
Kang et al.

(10) Patent No.: US 7,741,665 B2
(45) Date of Patent: Jun. 22, 2010

(54) HIGH-QUALITY CMOS IMAGE SENSOR AND PHOTO DIODE

(75) Inventors: Jin Yeong Kang, Daejeon (KR); Jin Gun Koo, Daejeon (KR); Sang Heung Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 214 days.

(21) Appl. No.: 11/872,922

(22) Filed: Oct. 16, 2007

(65) Prior Publication Data
US 2008/0105905 A1 May 8, 2008

(30) Foreign Application Priority Data
Oct. 25, 2006 (KR) .................. 10-2006-0104179

(51) Int. Cl.
*H01L 31/062* (2006.01)
*H01L 31/113* (2006.01)

(52) U.S. Cl. ................ 257/292; 257/444; 257/E27.132

(58) Field of Classification Search .............. 257/292, 257/293, 444, 448, E27.132; 250/208.1
See application file for complete search history.

(56) References Cited

U.S. PATENT DOCUMENTS

| 6,242,728 B1 | 6/2001 | Merrill et al. |
| 6,690,000 B1 | 2/2004 | Muramatsu et al. |
| 6,974,943 B2 | 12/2005 | Manabe et al. |
| 2006/0054988 A1* | 3/2006 | Kanbe .................. 257/448 |

FOREIGN PATENT DOCUMENTS

| JP | 08-316449 | 11/1996 |
| JP | 2001-345436 | 12/2001 |
| JP | 2004-320592 | 11/2004 |
| KR | 100175173 | 11/1998 |
| KR | 100278285 | 10/2000 |
| KR | 1020030001113 | 1/2003 |
| KR | 1020030001116 | 1/2003 |
| KR | 1020030067946 | 8/2003 |
| KR | 1020050115813 | 12/2005 |

OTHER PUBLICATIONS

Masayuki Furumiya, et al; "High-Sensitivity and No-Crosstalk Pixel Technology for Embedded CMOS Image Sensor;" IEEE Transactions on Electron Devices, vol. 48, No. 10, Oct. 2001.

* cited by examiner

*Primary Examiner*—Hoai V Pham
(74) *Attorney, Agent, or Firm*—Ladas & Parry LLP

(57) ABSTRACT

Provided are a high-quality CMOS image sensor and a photo diode, which can be fabricated in sub-90 nm regime using nanoscale CMOS technology. The photo diode includes: a p-type well; an internal n-type region formed under a surface of the p-type well; and a surface p-type region including a highly doped p-type SiGeC epitaxial layer or a polysilicon layer deposited on a top surface of the p-type well over the internal n-type region. The image sensor includes: a photo diode including an internal n-type region and a surface p-type region; a transfer transistor for transmitting photo-charges generated in the photo diode to a floating diffusion node; and a driving transistor for amplifying a variation in an electric potential of the floating diffusion node due to the photo-charges. The image sensor further includes a floating metal layer for functioning as the floating diffusion node and applying an electric potential from a drain of the transfer transistor to a gate of the driving transistor.

7 Claims, 9 Drawing Sheets

P-Substrate(6~25Ω.cm)

Epi Growing(6~25Ω.cm)

Pad Oxidation
CMP Stop Nitride Deposition
Mask Oxide Deposition

Trench Wet&RIE
Oxidation
Oxide Filling
CMP
Oxide Densify
Mask Oxide & Nitride Strip N/P-Well Implant
Drive-in Deep-N Implant
Vtn/Vtp Adjust Implant
Drive-in

HIGH-QUALITY CMOS IMAGE SENSOR AND PHOTO DIODE

CROSS-REFERENCE TO RELATED APPLICATION

This application claims priority to and the benefit of Korean Patent Application No. 2006-0104179, filed Oct. 25, 2006, the disclosure of which is incorporated herein by reference in its entirety.

BACKGROUND

1. Field of the Invention

The present invention relates to a four-transistor CMOS image sensor and, more preferably, to a high-quality sub-90 nm CMOS image sensor and a photo diode.

2. Discussion of Related Art

In high-quality CMOS image sensors (CIS) for data communication terminal devices, CMOS image sensors with three-million-plus pixels are not very sensitive to signals at low exposure. For this reason, the three-million-plus pixel CMOS image sensors are not put to practical use, but are instead replaced by CCD image sensors. However, since the CCD image sensor requires a high voltage of 10V or higher, a nanoscale CMOS circuit cannot be easily applied to the CCD image sensor, so it is difficult to make the CCD image sensor highly integrated. Furthermore, fabrication of the CCD image sensor is incompatible with that of typical CMOS devices. Thus, an image sensor module is bulky because it needs at least three chips, not just one. Additionally, the CCD image sensor consumes at least ten times the power that the CMOS image sensor does, owing to the high voltage, making it unsuitable for portable data terminals.

On the other hand, a CMOS image sensor includes a photo diode and a transistor in each image pixel, as in a typical CMOS device, and thus a conventional CMOS semiconductor fabrication process can be applied to fabrication of the CMOS image sensor without making any changes. Therefore, in contrast to the CCD image sensor requiring an additional chip with an image signal processor, the CMOS image sensor can cumulatively integrate an image signal processing circuit and an image detection circuit in a block outside a pixel, operate at a low voltage, and be fabricated at low cost.

A typical CMOS image sensor may be categorized as either a four-transistor pixel structure or a three-transistor pixel structure depending on the number of transistors of one pixel. The three-transistor pixel structure is superior to the four-transistor pixel structure in terms of fill factor and fabrication cost. However, the four-transistor pixel structure is normally used because a light receiving unit is separated from a detection unit and formed of silicon bulk except its surface, so that the four-transistor pixel structure is highly sensitive to light and resistant to dark current and noise.

The four-transistor pixel structure of the typical CMOS image sensor is illustrated in FIG. 1. A unit pixel is comprised of a photo diode (PD), which is a light sensor, and four NMOS transistors. Specifically, a transfer transistor Tx serves to transfer photo-charges generated in the photo diode PD to a diffusion node region FD, a reset transistor Rx serves to discharge charges stored in the diffusion node region FD or the photo diode PD in order to detect signals, a driving transistor Dx serves as a source follower transistor, and a switch transistor Sx is required for switching/addressing operations.

The photo diode PD and a capacitor 118, which are located parallel thereto, constitute a receiving unit, and the transfer transistor Tx transfers electrons generated by photons to a diffusion node 131. In order to obtain a two-dimensional image, an electric potential is applied through a gate 141 of the switch transistor Sx to select one column. In particular, each pixel is biased by a current source 150, which operates the driving transistor Dx and the switch transistor Sx to read an electric potential at the diffusion node 131 through an output node 142.

It has been five years since the development of the above-described CMOS image sensor has progressed in earnest. At present, the CMOS image sensor is being laboriously developed by Micron, Samsung Electronics, MagnaChip, and so on. However, the CMOS image sensor is being fabricated using CMOS technology in the 180 nm regime, but the fabrication of sub-90 nm nanoscale CMOS image sensors has not been attained yet.

Since the fabrication of CMOS image sensors makes use of silicon (Si) as a light absorbing material, high loss of signal is unavoidable in the short wavelength blue region where light is highly absorbed. Although, the magnitude of an image signal is not greatly degraded even if the CMOS image sensors are fabricated using conventional 130 nm CMOS technology, the magnitude of the image signal is considerably degraded at both low and high exposure when the CMOS image sensors are fabricated for sub-90 nm design rules, so that it is difficult to obtain high-quality products.

In other words, when CMOS image sensors are fabricated by means of conventional CMOS technology, the shrinkage of the receiving unit results in a rise in doping concentration, and the junction capacitance of a signal transmission layer (floating-N) increases, so that the magnitude of an image signal becomes insufficient at low exposure. Furthermore, as nanoscale CMOS technology leads to a drop in operating voltage, a sufficient saturation voltage cannot be obtained, and thus the CMOS image sensors cannot keep high image quality at high (saturated) exposure.

SUMMARY OF THE INVENTION

The present invention is directed to a CMOS image sensor that can prevent image quality from deteriorating at low exposure and/or saturated exposure.

One aspect of the present invention is to provide a photo diode including: a p-type well; an internal n-type region formed under a surface of the p-type well; and a surface p-type region including a highly doped p-type SiGeC epitaxial layer or a polysilicon layer deposited on a top surface of the p-type well over the internal n-type region.

Another aspect of the present invention is to provide an image sensor including: a photo diode including an internal n-type region and a surface p-type region; a transfer transistor for transmitting photo-charges generated in the photo diode to a floating diffusion node; and a driving transistor for amplifying a variation in an electric potential of the floating diffusion node due to the photo-charges, wherein the floating diffusion node includes an n-type signal transmission layer for applying an electric potential from a drain of the transfer transistor to a gate of the driving transistor, a p-type well disposed under the n-type signal transmission layer has a doping concentration lower than $1\times10^{16}/cm^3$ (preferably, $6\times10^{15}/cm^3 \sim 1\times10^{16}/cm^3$).

, and the internal n-type region has a doping concentration lower than $1\times10^6/cm^3$ (preferably, $7\times10^{15}/cm^3 \sim 10^{16}/cm^3$).

Still another aspect of the present invention is to provide an image sensor including: a photo diode including an internal n-type region and a surface p-type region; a transfer transistor for transmitting photo-charges generated in the photo diode to a floating diffusion node; and a driving transistor for amplifying a variation in an electric potential of the floating diffusion node due to the photo-charges. The image sensor further includes a floating metal layer for functioning as the floating diffusion node and applying an electric potential from a drain of the transfer transistor to a gate of the driving transistor.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EMBODIMENTS

The present invention provides four methods for improving the image quality of CMOS image sensors at low exposure.

Figure 8:
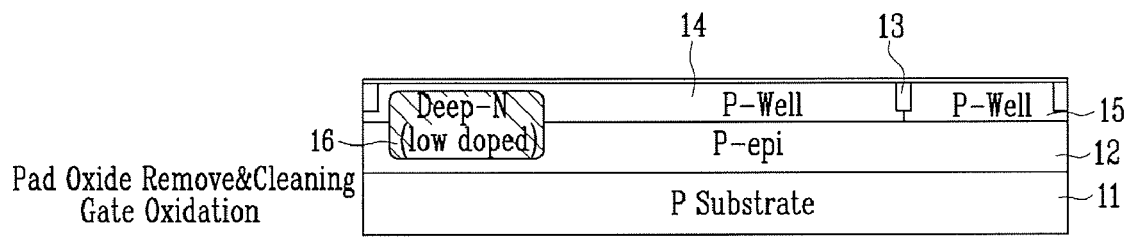

First, in order to minimize loss of signals in a short wavelength blue region where light is mostly absorbed on the surface of a photo diode PD, a surface p-type region of the photo diode PD is not formed using a conventional ion implantation process but is instead replaced by a highly doped thin layer, i.e., a p-type SiGeC epitaxial layer or a polysilicon (poly-Si) layer, as illustrated in FIG. 8.

The surface p-type region of the photo diode is required to prevent electrons from being additionally generated on the surface, not under the influence of light but through an electron-hole creation mechanism, and flowing into an internal n-type region (Deep-N), which is an electron collecting layer of the photo diode during exposure and sensing operations after resetting. As surface concentration becomes higher and doping depth becomes greater, the effect of the surface p-type region improves.

However, when the surface concentration is high, the lifespan of photo-generated electrons is shortened and the light absorbance of silicon in short-wavelength photo signals is very high, and thus electrons generated in the surface p-type region are mostly lost. For this reason, the surface p-type region should have a very small doping depth.

In order to obtain a small doping depth of 150 Å in a highly doped (preferably, $2\times10^{18}/cm^3 \sim 5\times10^{19}/cm^3$) surface, a p-type SiGeC chemical vapor deposition (CVD) process should be employed instead of a conventional ion implantation technique. A SiGeC layer, which is formed by the p-type SiGeC CVD process, can suppress diffusion of a p-type dopant (i.e., boron (B)) at a temperature of 700° C. or lower. The SiGeC layer is formed of 80% by weight of Si, 20% by weight of Ge, and 0.3% by weight of C. Furthermore, the SiGeC layer may be obtained using a reduced pressure CVD (RPCVD) process or an ultra-high vacuum CVD (UHVCVD) process. In this process, the surface p-type region of the photo diode PD may be formed at a high concentration of about $1\times10^{19}/cm^3$ (preferably, $2\times10^{18}/cm^3$ to $5\times10^{19}/cm^3$).

Second, in order to secure a high-quality image signal at low exposure, i.e., in order to reach a saturated exposure from a low exposure of 1000 lx within 5 ms, an electron collecting layer (or a deep-N layer), which is an intermediate layer of the photo diode, and a p-type well, which is disposed under a signal transmission layer (or a floating-N layer) for transmitting signals from the deep-N layer to a sensing unit, may both be formed using a low concentration layer of which concentration is lower than $1\times10^{16}/cm^3$. Alternatively, the signal transmission layer (deep-N layer) may be replaced by a floating metal layer.

By lowering the n-type concentration of the signal transmission layer (deep-N layer), the junction capacitance of the photo diode decreases, so that a big voltage drop can arise in weak light at an initial high voltage after the photo diode is reset. In addition, the lowering of the concentration of the p-type well that is disposed under the signal transmission layer (deep-N layer) permits a voltage difference of the photo diode to be transmitted to a gate of a driving transistor without loss during a sensing operation. The method of lowering the concentration of the p-type well is quite effective in the sub-180 nm regime.

Figure 16:
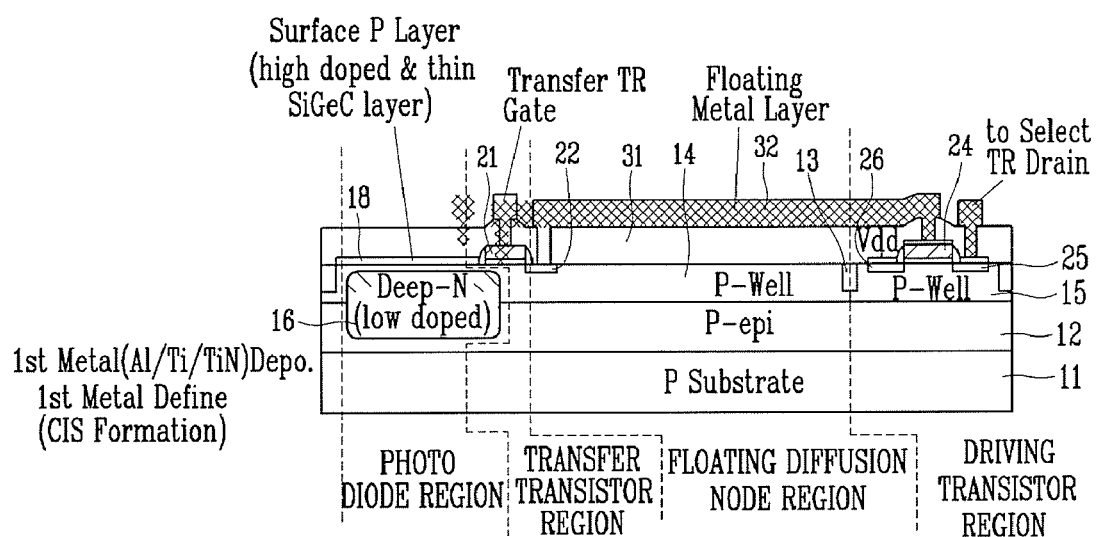

In another method, instead of lowering the concentration of the p-type well, the floating metal layer may be formed by connecting the signal transmission layer (deep-N layer) with a metal interconnection line as illustrated in FIG. 16.

By replacing the signal transmission layer (deep-N layer) by the floating metal layer, the concentration of the p-type well can increase from $1\times10^{16}/cm^3$ to $1\times10^{18}/cm^3$ or higher using conventional nanoscale CMOS technology. Thus, this method is more compatible with other fabrication processes than the conventional nanoscale CMOS technology, and the resulting highly doped p-type well can be more sensitive to signals than a low-doped well at low exposure. However, since a lowest output signal varies within a larger range according to the dimension of the gate of the driving transistor after the sensing operation, it is necessary to tune the dimensions of the gates of the driving transistor and a selection transistor more scrupulously during the designing of a pixel circuit.

Third, the threshold voltages of all transistors (i.e., reset, transfer, driving, and selection transistors) in a pixel may be lowered to about 0 V or lower, preferably, 0 to −0.5 V. In other words, all the transistors of the pixel may be replaced by zero-threshold-voltage transistors or depletion-type transistors. When the threshold voltages of the transistors decrease from 0.2 V to 0 V or lower, voltage loss caused by the threshold voltages can be prevented even while the CMOS image sensor operates at a low voltage. As a result, the range of an operating voltage can expand at saturated exposure, so that a high-quality image signal can be obtained.

In this field, several patents and papers have emphasized the effectiveness of a low threshold voltage in some transistors of reset, transfer, and driving transistors of a three-transistor pixel structure or a four-transistor pixel structure. However, the present invention discloses that all transistors (reset, transfer, driving, and selection transistors) including the selection transistor should have low threshold voltages of 0V or lower. Further, according to the present invention, the driving and selection transistors should be formed to almost the same dimension to have virtually the same gain, so that the highest image quality can be always obtained under all exposure and operating conditions.

Fourth, the equivalent oxide thicknesses (EOT) of all transistors in a pixel may be kept at a high value of 30 Å or higher (preferably, 30 to 50 Å), and a power supply voltage terminal Vdd and an "on" voltage Vg, which is applied to the gates of all the transistors (reset, transfer, driving, and selection transistors) during reset and sensing operations, may be elevated from about 1 V to 1.8~2V. This method may be used as the last measure in order to obtain a sufficient image signal, i.e., the highest image quality, at saturated exposure. Simulation results demonstrate that the fourth method is more effective than the other methods of changing the sensing structure, such as the methods of increasing the area of the photo diode and controlling the doping concentration.

The present invention will now be described more fully hereinafter with reference to the accompanying drawings, in which exemplary embodiments of the invention are shown. This invention may, however, be embodied in different forms and should not be construed as limited to the embodiments set forth herein.

Embodiment 1

Figure 2:
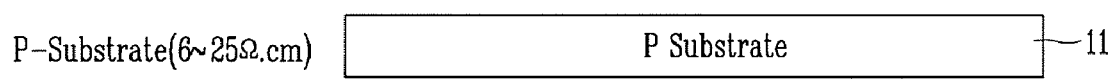
FIGS. 2 through 16 are cross-sectional views illustrating a process of fabricating an image sensor according to an exemplary embodiment of the present invention.

Referring to FIG. 2, a p-type Si substrate 11, which is doped with boron (B) at a concentration of 6 to 25 Ω·cm, is prepared.

Figure 3:
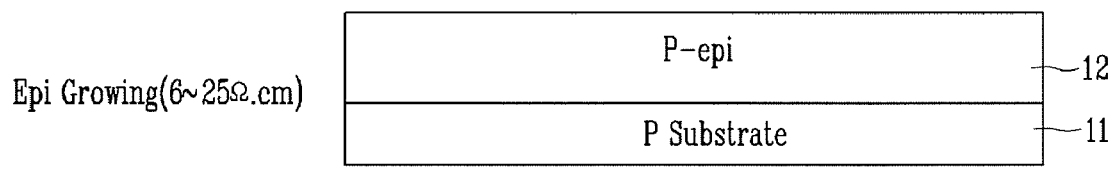

Referring to FIG. 3, a Si epitaxial layer 12 is grown on the Si substrate 11 to fabricate a uniform image sensor. The Si epitaxial layer 12 has a fewer lattice defect and a more uniform doping concentration than the substrate 11. The Si epitaxial layer is a p-type layer, which is formed to a thickness of 1 to 5 µm and doped with B at a concentration of 6 to 25 Ω·cm.

Figure 4:
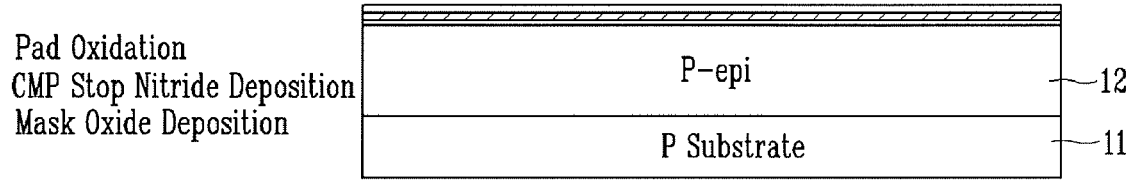

Referring to FIG. 4, before a trench for isolating elements is formed, a pad oxide layer ($SiO_2$) is grown on the resultant structure, a silicon nitride layer ($Si_3N_4$) is formed to facilitate the control of processes during a chemical mechanical polishing (CMP) process, and an oxide layer is coated to facilitate the patterning of the silicon nitride layer. The stacked structure of the pad oxide layer, the silicon nitride layer, and the oxide layer as illustrated in FIG. 4 is similar to the conventional case.

Figure 5:
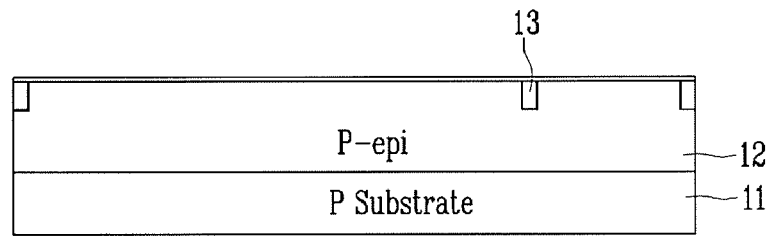

Referring to FIG. 5, the silicon nitride layer is patterned, a trench is etched, and an inner wall of the trench is thermally oxidized and coated with an oxide layer to fill the trench. Thereafter, the oxide layer excluding the trench is planarized through a CMP process using the silicon nitride layer as an etch stop layer and thermally treated to make the oxide layer highly dense, and then the remaining silicon nitride layer is removed by a wet etching process. As a result, an isolation trench 13 is completed. The formation of the trench 13 as illustrated in FIG. 5 is similar to the conventional case.

Figure 6:
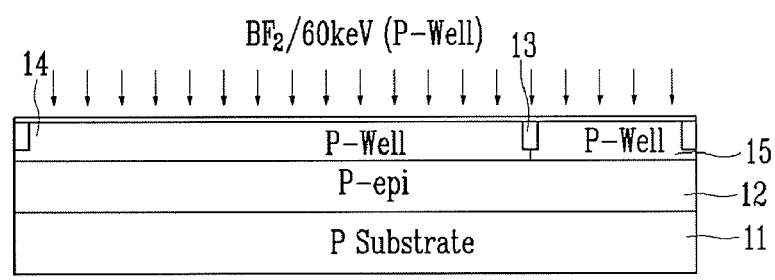

Referring to FIG. 6, wells 14 and 15 are formed using an ion implantation process to form an active layer. Specifically, boron (B) ions are implanted into an NMOS region, while phosphorus (P) ions are implanted into a PMOS region. Thereafter, the regions where the B and P ions are implanted are thermally treated to diffuse the B and P ions, so that the wells 14 and 15 are finally formed to an appropriate depth of 1 to 2 µm.

Figure 7:
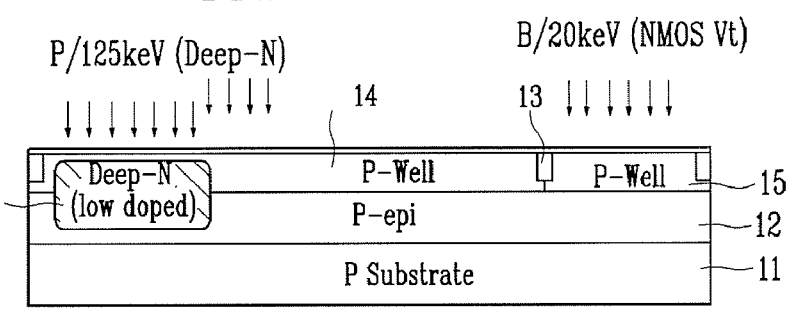

Referring to FIG. 7, P ions are implanted to form an internal n-type region (deep-N) 16 for an electron collecting layer in the center of a photo diode PD. Subsequently, B and P ions are implanted in appropriate amounts into the wells 14 and 15, respectively, and thermally treated in order to control threshold voltages Vt of the NMOS and PMOS regions.

Referring to FIG. 8, the pad oxide layer is removed, and a gate oxide layer of which surface is cleaned is grown on the resultant structure.

Figure 9:
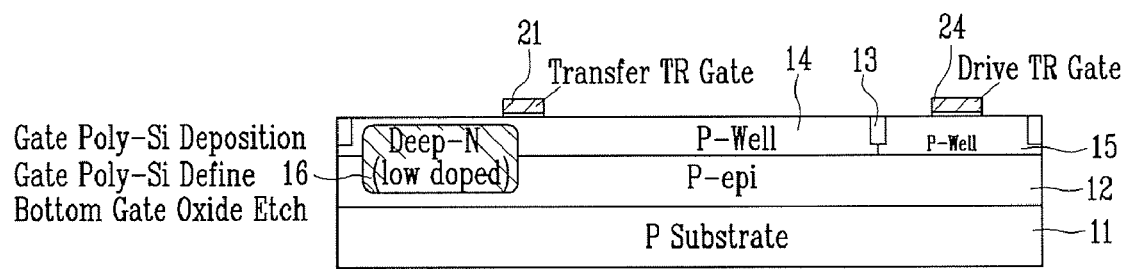

Referring to FIG. 9, a poly-Si layer for a gate is coated on the oxide layer and then patterned to form CMOS gates 21 and 24. Afterwards, the gate oxide layer that is disposed under a region other than the gates 21 and 24 is removed in order to prepare doping into source and drain regions on both sides of the gates 21 and 24.

Figure 10:
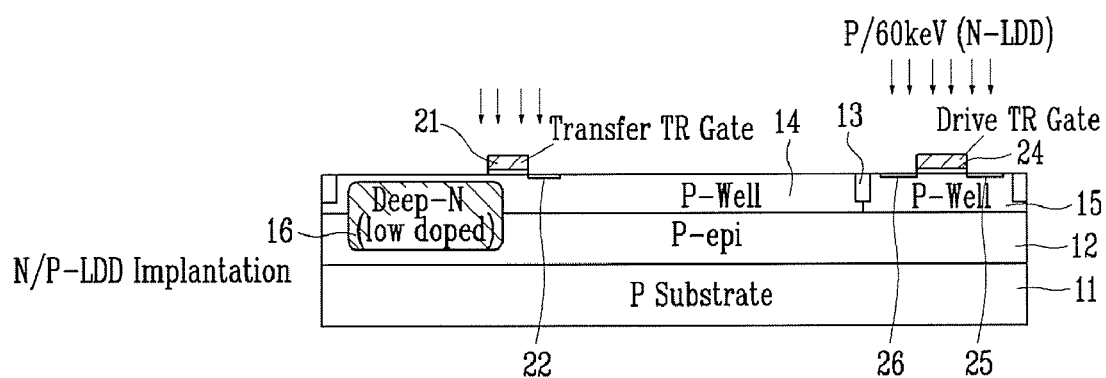

Referring to FIG. 10, a primary doping process is performed on source and drain regions 22, 25, and 26 using an ion implantation process. This primary doping process serves to increase a breakdown voltage and reduce hot carriers and leads to formation of a lightly doped drain (LDD) structure.

Figure 11:
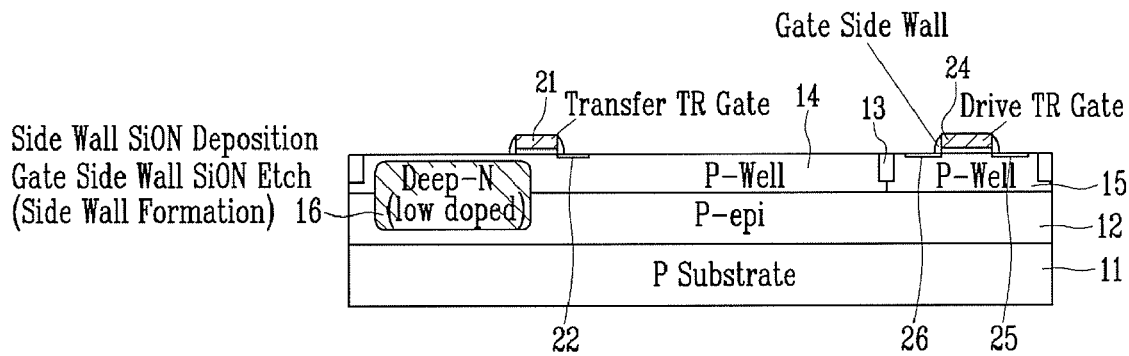

Referring to FIG. 11, a nitride oxide layer (SiON) is coated on the resultant structure and etched in a vertical direction so that a sidewall layer is formed. The sidewall layer can improve insulation characteristics between the gates 21 and 24 and the source and drain regions 22, 25, and 26.

Figure 12:
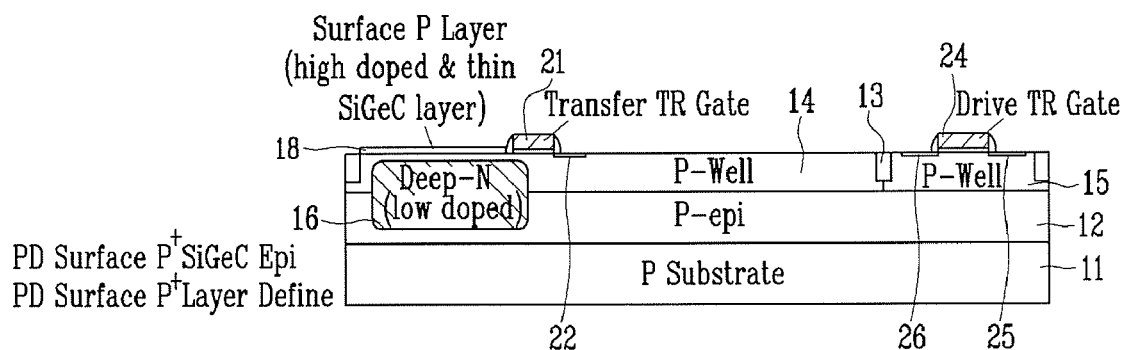

Referring to FIG. 12, a surface p-type region 18 may be formed on the photo diode PD. To form the surface p-type region 18, an epitaxial thin layer or a poly-Si thin layer may be formed of SiGe or SiGeC. During growth, the thin layer may be doped with B ions at a high concentration of $1 \times 10^{19}/cm^3$ (preferably, $2 \times 10^{19}/cm^3 \sim 5 \times 10^{19}/cm^3$) and formed to a very small thickness of 150 Å or less (preferably, 100 Å~150 Å). The thin layer may be patterned so that the surface p-type region 18 is left only on the photo diode PD. The surface p-type region 18 prevents electrons from flowing from the surface to the photo diode PD and reduces dark noise during a drive operation.

Figure 13:
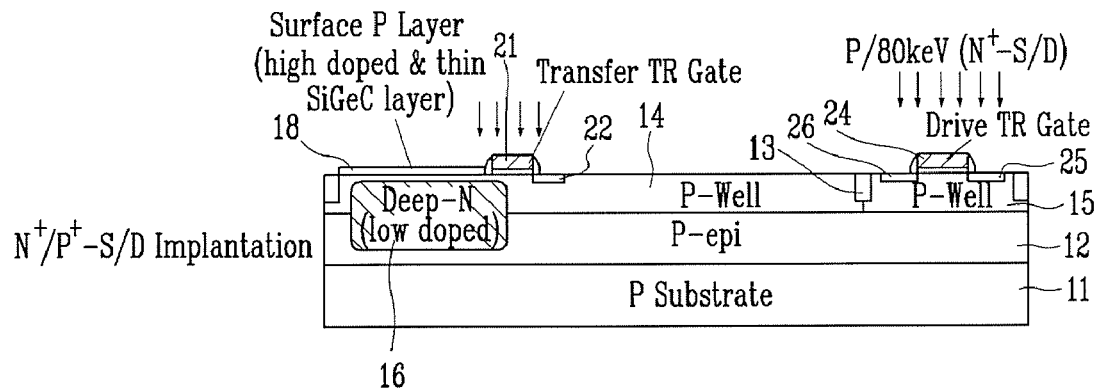

Referring to FIG. 13, the source and drain regions 22, 25, and 26 may be grown using a high-concentration doping process.

Figure 14:
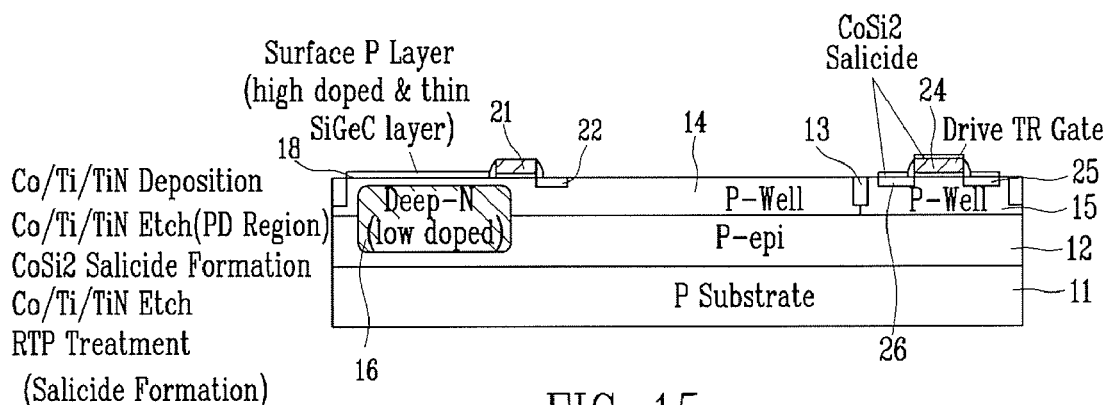

Referring to FIG. 14, in order to lower resistance in the gate, source, and drain regions 21, 23, 24, 25, and 26, a layer of Co/Ti/TiN may be deposited, treated using a primary low-temperature rapid thermal processing (RTP) process, etched using a wet etching process, and finally treated using a secondary thermal process, so that a silicide layer ($CoSi_2$) layer is selectively formed only in a region where the Si layer is exposed.

Figure 15:
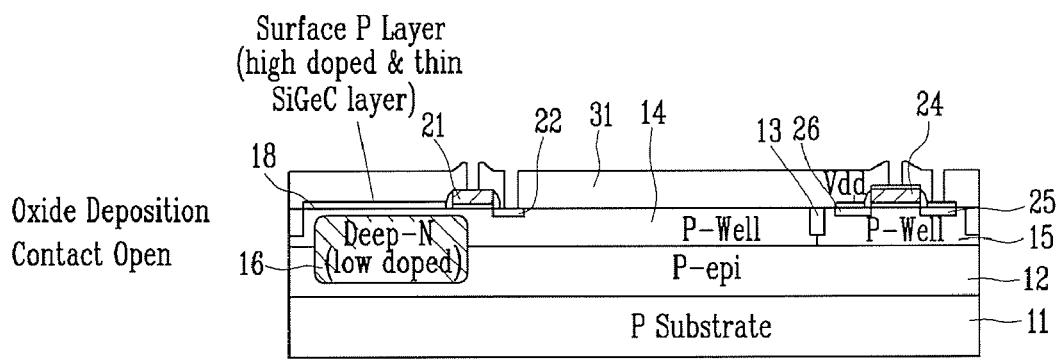

Referring to FIG. 15, an interlayer insulating oxide layer is formed on the resultant structure, and a contact opening is formed between a semiconductor layer and a floating metal layer.

Referring to FIG. 16, a layer of Al/Ti/TiN is deposited and patterned to form the floating metal layer as a metal interconnection line. In this process, a CMOS image sensor (CIS) according to the present invention is completed as illustrated in FIG. 16.

In the CMOS image sensor fabricated according to the present embodiment, the photo diode PD includes the p-type well 14, the internal n-type region 16, which is formed in the p-type well 14, and the surface p-type region 18, which is deposited on the p-type well 14 over the internal n-type region 16 and formed of a highly doped p-type SiGeC epitaxial thin layer, as illustrated in FIG. 16. Alternatively, the surface p-type region 18 may be formed of a highly doped p-type poly-Si thin layer. The surface p-type region 18 has a high concentration of about $1 \times 10^{19}/cm^3$ (preferably, $2 \times 10^{18}/cm^3$ to $5 \times 10^{19}/cm^3$).

The photo diode shown in FIG. 16 includes the surface p-type region 18, which is formed using a highly doped $p^+$-type SiGeC thin layer, so that loss of a signal in the short wavelength region can be halved as compared with the conventional case.

Figure 1A:
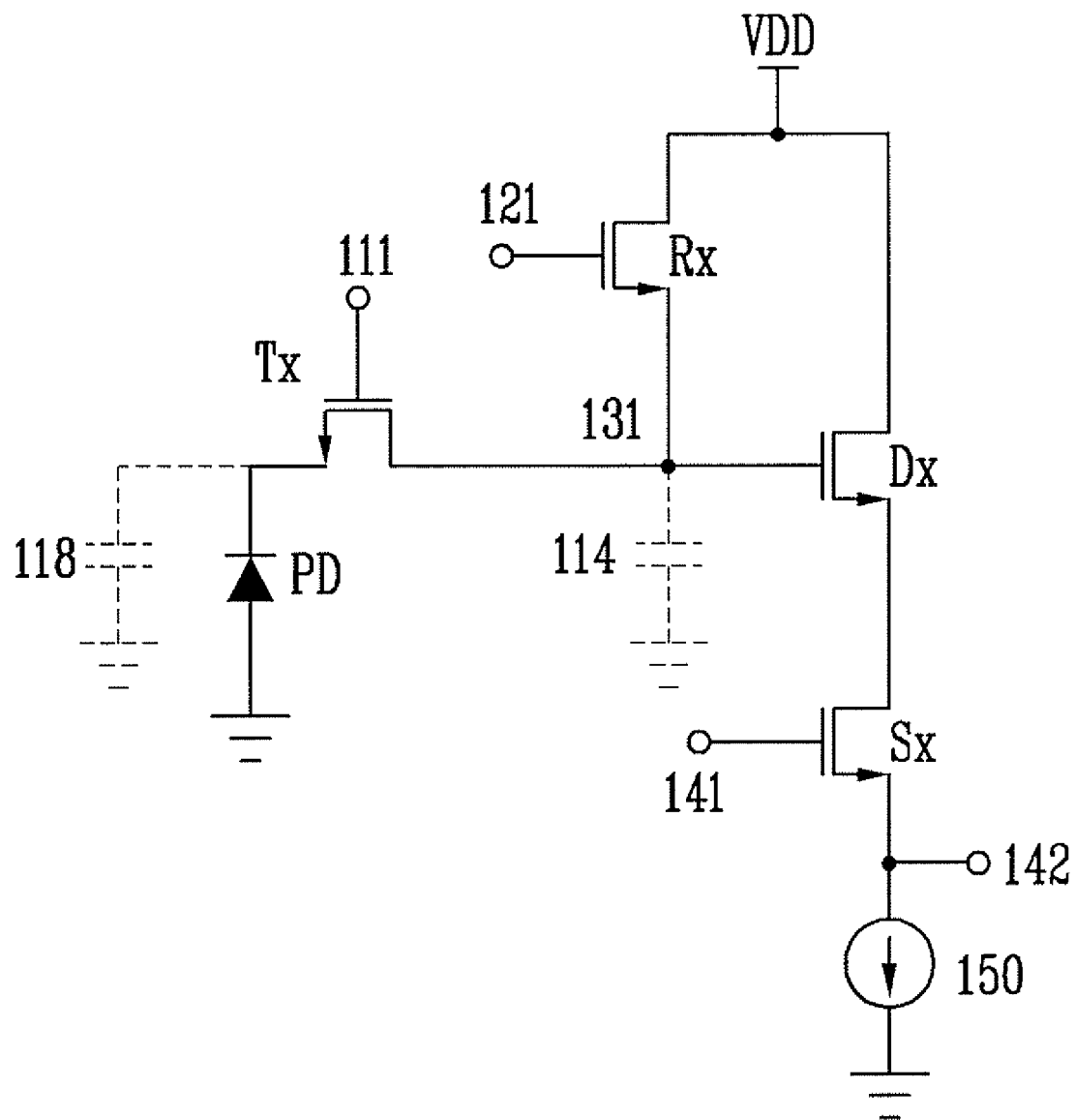
FIG. 1A is a circuit diagram of a conventional four-transistor CMOS image sensor.
Figure 1B:
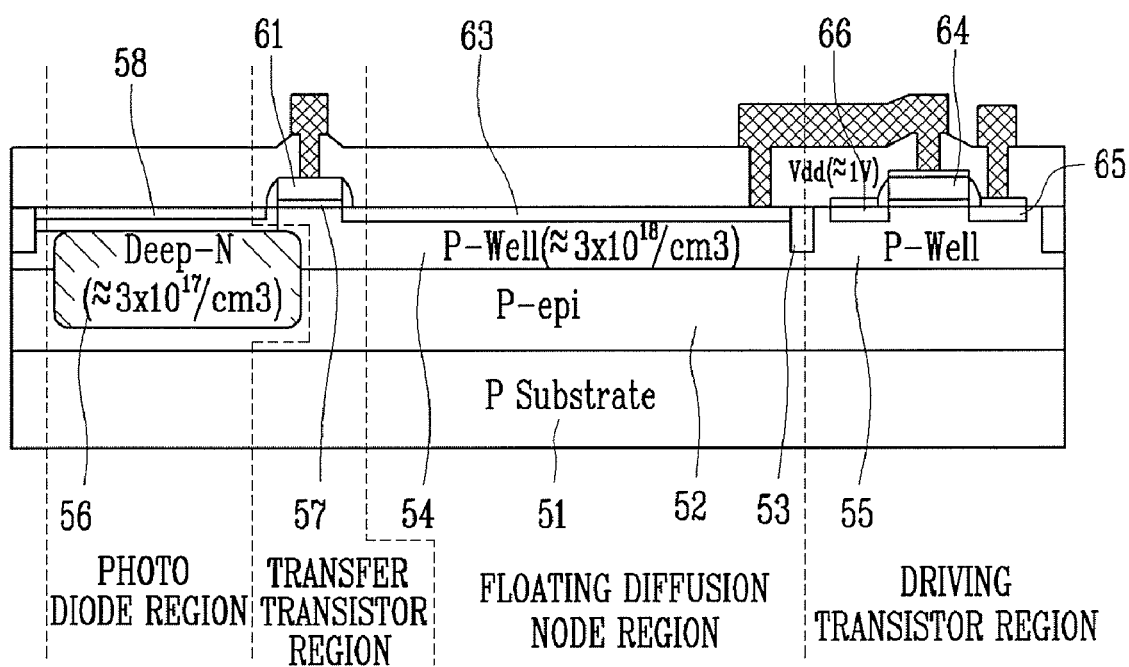
FIG. 1B is a cross-sectional view of a conventional image sensor.

As compared with the conventional CMOS image sensor shown in FIG. 1B, the CMOS image sensor according to the present embodiment includes a floating metal layer 32 parallel to a floating diffusion region instead of an n-type signal transmission layer 63 shown in FIG. 1B. Although the floating metal layer 32 is formed on an insulating layer 31 in FIG. 16, a portion of the floating metal layer 32 may be formed as an n-type diffusion layer between the p-type well 14 and the insulating layer 31 like the conventional n-type signal transmission layer 63. In this case, a portion of the p-type well 14, which is disposed under the n-type diffusion layer, may be doped at a low concentration of about $1 \times 10^{16}/cm^3$ (preferably, $6 \times 10^{15}/cm^3$ to $1 \times 10^{16}/cm^3$). In both cases, the floating metal layer 32 facilitates transmission of a sensing signal from a floating diffusion node to a gate of a driving transistor. As a result, a drop in the intensity of signals at low exposure due to a reduction in the area of the photo diode PD can be doubled as compared with the conventional case.

In the CMOS image sensor fabricated according to the above-described processes of the present embodiment, threshold voltages Vt of all transistors (i.e., reset, transfer, driving, and selection transistors) in a pixel may be lowered to 0V or lower and replaced by zero-threshold-voltage transistors or depletion-type transistors. Thus, voltage loss caused by a threshold voltage can be prevented even at a low operating voltage of the CMOS image sensor.

In the CMOS image sensor fabricated according to the above-described processes of the present embodiment, EOTs of all the transistors in the pixel may be kept at a high value of 30 Å or higher, and a power supply voltage terminal Vdd and an "on" voltage Vg, which is applied to the gates of all the transistors (reset, transfer, driving, and selection transistors) during reset and sensing operations, may be elevated from about 1 V to 1.8~2V. In this method, the highest image quality can be obtained as described above.

As explained thus far, in order to fabricate an advanced CMOS image sensor that has a small size and requires low power and only a single chip, the CMOS image sensor may be fabricated mostly using conventional nanoscale CMOS technology. However, the present invention utilizes quantitative analysis and provides measures to overcome problems that may happen when the conventional nanoscale CMOS technology is applied to the advanced CMOS image sensor exactly as it is.

Modeling and an integrated simulation tool of all operations (i.e., reset, exposure, and sensing operations) were developed for the quantitative analysis of the nanoscale CMOS image sensor. Thus, improvements in image quality affected by device structures and operating modes were calculated and analyzed. In this method, improvements in the operating characteristics of 250 nm to 65 nm CMOS image sensors were itemized and quantitatively obtained.

Figure 18:
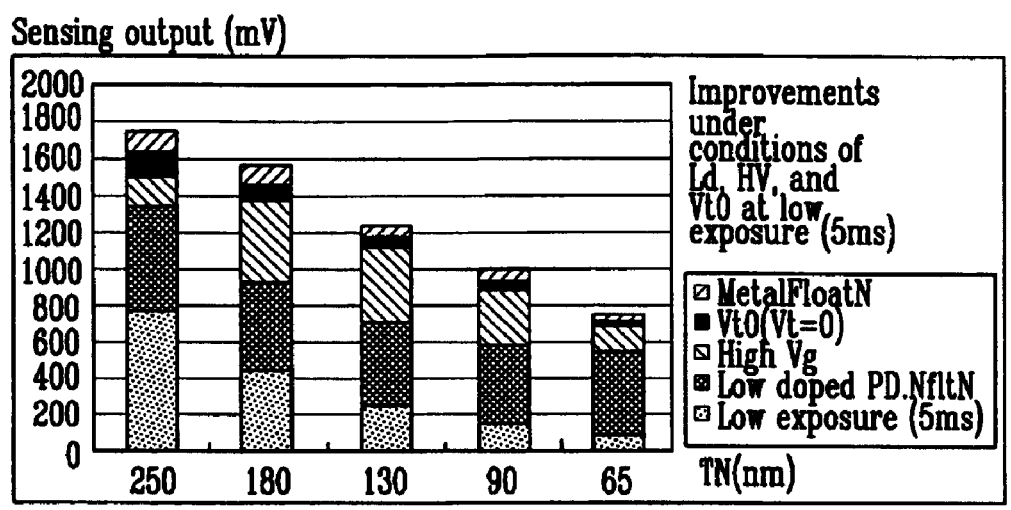
FIG. 18 illustrates the results of a CIS simulation conducted on the structure shown in FIG. 16 showing improvements in output signals at low exposure.
Figure 19:
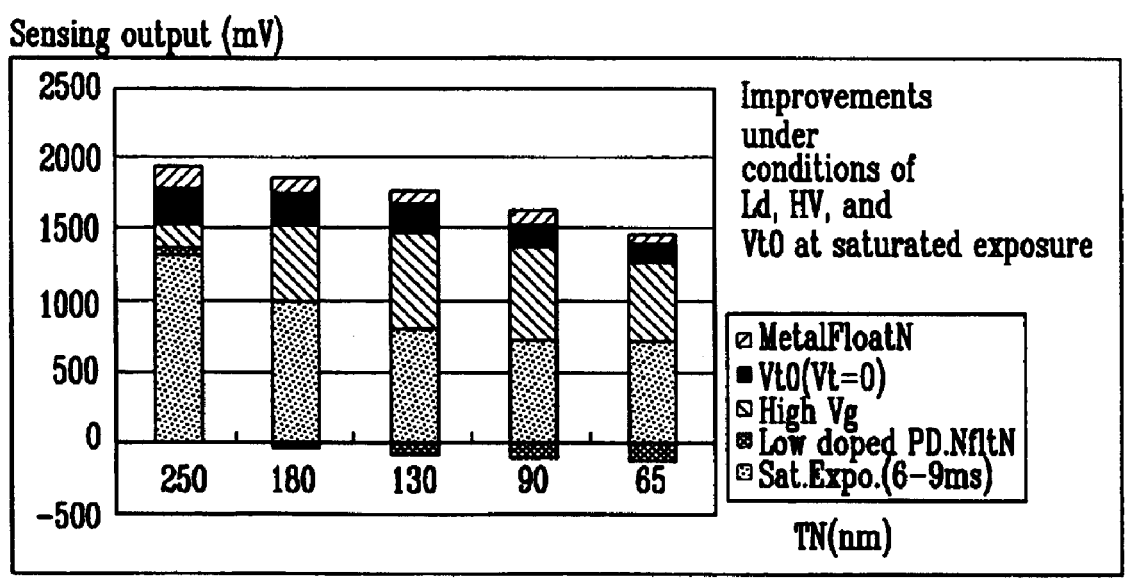
FIG. 19 illustrates the results of the CIS simulation conducted on the structure shown in FIG. 16 showing improvements in output signals at saturated (high) exposure.

A simulation was conducted on the structure shown in FIG. 16 using the foregoing simulation tool and its results are shown in FIG. 18. This simulation was executed for 250 nm to 65 nm design rules on the basis of technology node (TN) under exposure conditions that low exposure was 1000 lx (exposure time is 5 ms) and saturated exposure was obtained with the highest output signal on the basis of a sunlight spectrum that reaches the surface of the earth. Further, every sensing operation was performed at an output current of 10 μA. FIG. 18 shows the results of a CIS simulation, which shows improvements in output signals at low exposure, while FIG. 19 shows the results of the CIS simulation, which shows improvements in output signals at saturated (high) exposure. The characteristics and conditions of FIGS. 18 and 19 are as follows.

1) "Ld, Low doped PD. FltN" shows improvements on the condition of low-doped ($1 \times 10^{16}/cm^3$) Deep-N and Floating-N.

2) "HV, High Vg" shows improvements on the condition that the power supply voltages Vdd and gate voltages Vg of all the transistors (i.e., the reset, transfer, driving, and selection transistors) are kept at a high value of 1.8 to 2V.

3) "Vt0" shows improvements on the condition that all the transistors are replaced by zero-threshold-voltage transistors.

4) "Metal Float-N" shows improvements on the condition that the floating-N layer is replaced by a metal interconnection line.

5) "Low exposure" is 1000 lx (exposure time: 5 ms) on the basis of a sunlight spectrum that reaches the surface of the earth.

6) "Sat.Expo." is 1000 lx (each exposure time: 6~9 ms).

Embodiment 2

Figure 17:
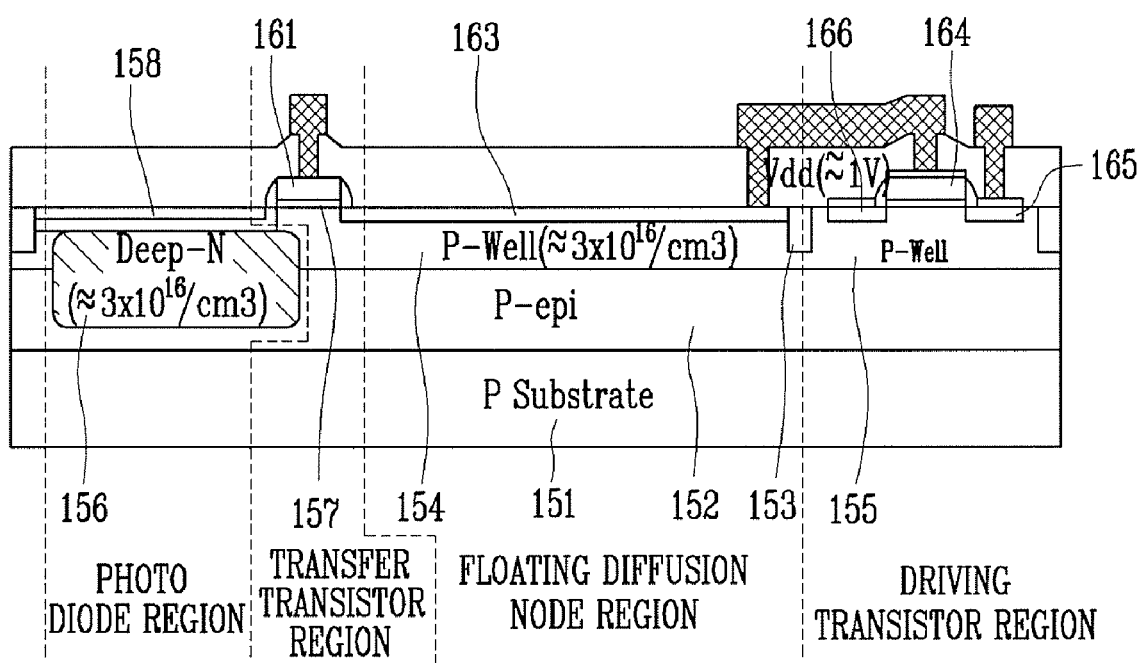
FIG. 17 is a cross-sectional view of a completed image sensor according to another exemplary embodiment of the present invention.

A CMOS image sensor according to the present embodiment as illustrated in FIG. 17 includes a photo diode with the same structure as that in the first embodiment, and an n-type signal transmission layer 163 is disposed in a floating diffusion node region instead of the floating metal layer of the first embodiment. However, the present embodiment is different from the conventional case in that a p-type well 154, which is disposed under the n-type signal transmission layer 163, has a doping concentration of about $1 \times 10^{16}/cm^3$ (preferably, $6 \times 10^{15}/cm^3$ to $1 \times 10^{16}/cm^3$), while the conventional p-type well has a doping concentration of $3 \times 10^{18}/cm^3$.

Also, an internal n-type region 158 of the photo diode according to the present embodiment has a doping concentration of about $1 \times 10^{16}/cm^3$ (preferably, $7 \times 10^{15}/cm^3$ to $1 \times 10^{16}/cm^3$), while the conventional internal n-type region has a doping concentration of $3 \times 10^{17}/cm^3$.

The above-described n-type signal transmission layer 163 and internal n-type region 158 facilitate transmission of a sensing signal from a floating diffusion node to a gate 164 of a driving transistor. As a result, a drop in the intensity of signals at low exposure due to a reduction in the area of the photo diode PD can be doubled as compared with the conventional case.

Operating principles and fabrication processes of the CMOS image sensor according to the present embodiment can be analogized from the above description of the first embodiment, and thus a detailed explanation thereof will be omitted here.

Furthermore, improvements undergone on the first condition of a structural change in the photo diode, the third condition of the threshold voltage of 0V or lower, and the fourth condition of great EOTs can be analogized from the above description of the first embodiment, and thus a detailed explanation will be omitted here.

According to the embodiments of the present invention as described above, a high-quality low-power subminiature CMOS image sensor can be made at low cost.

Specifically, in contrast to conventional CMOS image sensors featuring 1.3 to 2-million-pixel resolution based on 180 to 130 nm CMOS technology, the present invention provides a high-quality 8-million-pixel CMOS image sensor having an optical format of ⅐ inch or less, which can be fabricated to a module thickness of 5 mm or less using 65 nm CMOS technology. According to the present invention, a presently used 2-million-plus pixel CCD image sensor may be superseded by a CMOS image sensor which requires only a single chip and reduces power to a tenth of power consumed by the CCD image sensor. Finally, an image sensor for portable devices can be packaged to a height of 5 mm or lower.

In particular, a 65 nm image sensor according to the present invention has the following effects.

First, since a highly doped p$^+$-type SiGeC thin layer is used as a surface layer, loss of signals in the short wavelength blue region can be halved, so that the three primary colors can keep balance in signal intensity.

Second, an n-type doping concentration of an internal n-type region (deep-N) is lowered, and the doping concentration of a lower bottom layer (p-type well) of a signal transmission layer (floating-N) is also lowered or the signal transmission layer is replaced by a floating metal layer, so that a drop in the intensity of signals at low exposure due to a reduction in the area of a photo diode can be doubled.

Third, by dropping threshold voltages Vt of all transistors in a pixel to 0V or lower, signal intensity can increase to 10% at saturated exposure.

Fourth, the EOTs of all the transistors in the pixel are kept at a sufficient value, and a power supply voltage and gate voltages are elevated, and thus signal intensity can be doubled at saturated exposure.

In the drawings and specification, there have been disclosed typical preferred embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A photo diode comprising:
   a p-type well;
   an internal n-type region formed under a surface of the p-type well; and
   a surface p-type region including a highly doped p-type SiGeC epitaxial layer or a polysilicon layer deposited on a top surface of the p-type well over the internal n-type region.

2. The photo diode according to claim 1, wherein the surface p-type region has a doping concentration of $2\times10^{18}$/cm$^3$ or higher (preferably, $2\times10^{18}$/cm$^3$~$5\times10^{19}$/cm) and a thickness of 150 Å or less (preferably, 100 Å~150 Å).

3. An image sensor comprising:
   a photo diode including an internal n-type region and a surface p-type region;
   a transfer transistor for transmitting photo-charges generated in the photo diode to a floating diffusion node; and
   a driving transistor for amplifying a variation in an electric potential of the floating diffusion node due to the photo-charges,
   the image sensor further comprising a floating metal layer for functioning as the floating diffusion node and applying an electric potential from a drain of the transfer transistor to a gate of the driving transistor.

4. The image sensor according to claim 3, wherein the photo diode is the photo diode comprising a p-type well; an internal n-type region formed under a surface of the p-type well; and a surface p-type region including a highly doped p-type SiGeC epitaxial layer or a polysilicon layer deposited on a top surface of the p-type well over the internal n-type region.

5. The image sensor according to claim 3, wherein the transfer transistor and the driving transistor are depletion-type transistors of which threshold voltages are 0V or lower (preferably, −0.5V~0V).

6. The image sensor according to claim 3, further comprising:
   a reset transistor for resetting the floating diffusion node; and
   a selection transistor for controlling an output signal of the driving transistor,
   wherein the reset transistor and the selection transistor are depletion-type transistors of which threshold voltages are 0V or lower (preferably, −0.5V~0V).

7. The image sensor according to claim 3, further comprising:
   a reset transistor for resetting the floating diffusion node; and
   a selection transistor for controlling an output signal of the driving transistor,
   wherein the transfer transistor, the driving transistor, the reset transistor, and the selection transistor have gate oxide layers formed to thickness of 30 Å or more (preferably, 30 Å~50 Å).

* * * * *